United States Patent
Hayashi et al.

(10) Patent No.: US 8,895,975 B2
(45) Date of Patent: Nov. 25, 2014

(54) PHOTOELECTRIC ELEMENT

(75) Inventors: Naoki Hayashi, Kyoto (JP); Michio Suzuka, Osaka (JP); Takashi Sekiguchi, Osaka (JP); Takeyuki Yamaki, Nara (JP); Hiroyuki Nishide, Tokyo (JP); Kenichi Oyaizu, Tokyo (JP); Fumiaki Kato, Tokyo (JP); Naoki Sano, Tokyo (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 0 days.

(21) Appl. No.: 13/982,082

(22) PCT Filed: Mar. 5, 2012

(86) PCT No.: PCT/JP2012/055521
§ 371 (c)(1),
(2), (4) Date: Jul. 26, 2013

(87) PCT Pub. No.: WO2012/121194
PCT Pub. Date: Sep. 13, 2012

(65) Prior Publication Data
US 2013/0306954 A1    Nov. 21, 2013

(30) Foreign Application Priority Data
Mar. 10, 2011    (JP) .................. 2011-053583

(51) Int. Cl.
*H01L 29/08* (2006.01)
*H01L 35/24* (2006.01)
(Continued)

(52) U.S. Cl.
CPC .......... *H01G 9/2018* (2013.01); *H01L 51/0072* (2013.01); *H01L 51/004* (2013.01); *H01L*
(Continued)

(58) Field of Classification Search
CPC ............ H01L 51/0035; H01L 51/0072; H01L 51/5048; H01L 51/0004; H01L 51/0043; H01L 51/0051; H01L 51/422; H01L 51/52
USPC ................................................ 257/40; 438/99
See application file for complete search history.

(56) References Cited

U.S. PATENT DOCUMENTS
5,683,832 A    11/1997    Bonhote et al.
(Continued)

FOREIGN PATENT DOCUMENTS
EP    0718288 B1    6/2005
(Continued)

OTHER PUBLICATIONS
International Search Report for corresponding International Application No. PCT/JP2012/055521 mailed May 15, 2012.
(Continued)

Primary Examiner — Colleen A Matthews
Assistant Examiner — Quovaunda V Jefferson
(74) Attorney, Agent, or Firm — Renner, Otto, Boisselle & Sklar, LLP

(57) ABSTRACT

Provided is a photoelectric element that includes an electron transport layer having excellent electron transport properties and a sufficiently large reaction interface and has low resistance loss and excellent conversion efficiency between light and electricity. The photoelectric element includes a first electrode 3, a second electrode 4, an electron transport layer 1 and a hole transport layer 5 interposed between the first electrode 3 and the second electrode 4, an electrolyte solution, and a sensitizing dye. The electron transport layer 1 includes an organic compound having an oxidation-reduction site capable of repeated oxidation-reduction. The electrolyte solution serves to stabilize a reduction state of the oxidation-reduction site. The organic compound and the electrolyte solution form a gel layer 2. The sensitizing dye is provided in contact with the electron transport layer 1. The hole transport layer 5 contains a charge transporter serving to reduce an oxidized form of the sensitizing dye and having a number average molecular weight of 2,000 or more and 100,000 or less.

4 Claims, 1 Drawing Sheet

(51) Int. Cl.
*H01L 51/00* (2006.01)
*H01G 9/20* (2006.01)
*H01L 51/42* (2006.01)

(52) U.S. Cl.
CPC . 51/0043 (2013.01); *H01L 51/0035* (2013.01); *H01L 51/422* (2013.01); *H01G 9/2031* (2013.01); *H01G 9/2059* (2013.01); *Y02E 10/542* (2013.01)
USPC .............................................. 257/40; 438/99

(56) References Cited

U.S. PATENT DOCUMENTS

| | | |
|---|---|---|
| 5,728,487 A | 3/1998 | Gratzel et al. |
| 2006/0194075 A1 | 8/2006 | Miyamoto et al. |
| 2012/0119193 A1 | 5/2012 | Sekiguchi et al. |
| 2013/0025683 A1 | 1/2013 | Sekiguchi et al. |

FOREIGN PATENT DOCUMENTS

| | | |
|---|---|---|
| JP | 07-288142 A | 10/1995 |
| JP | 2003-264304 A | 9/2003 |
| JP | 2006-237404 A | 9/2006 |
| JP | 2010-123376 A | 6/2010 |
| JP | 2011-023344 A | 2/2011 |
| JP | 2011-034813 A | 2/2011 |
| WO | 95/18456 A1 | 7/1995 |
| WO | WO 2010/024090 A1 | 3/2010 |
| WO | WO 2011/013760 A1 | 3/2011 |

OTHER PUBLICATIONS

P. Peumans et al., "Very-high-efficiency double-heterostructure copper phthalocyanine/$C_{60}$ photovoltaic cells", *Appl. Phys. Lett.*, No. 79, 2001, p. 126.

C.W. Tang, "Two-layer organic photovoltaic cell", *Appl. Phys. Lett.*, No. 48 1986, p. 183.

S.E. Shaheen et al., "2.5% efficient plastic solar cells", Appl. Phys. Lett., No. 78, 2001, p. 841.

J.H. Schon et al., "Efficient organic photovoltaic diodes based on doped pentacene", *Nature* (London), No. 403, 2000, p. 408.

Imahori et al., "*Bunshi Taiyo Denchi No Tenbo(Prospects of Molecular Solar Cells)*", Jul. 2001 issue of Kagaku Kogyo, p. 41, translation of abstract attached.

*Denki Kagaku (Electrochemistry)* vol. 65, No. 11 p. 923(1997), translation of abstract attached (abstract of "The recent development of the polymer solid electrolyte").

Papageorgiou et al., "The Performance and Stability of Ambient Temperature Molten Salts for Solar Cell Applications", *J.Electrochem.Soc.*, vol. 143, No. 10, p. 3099(1996).

Bonhôte et al., "Hydrophobic, Highly Conductive Ambient-Temperature Molten Salts", *Inorg.Chem.*, vol. 35, p. 1168(1996).

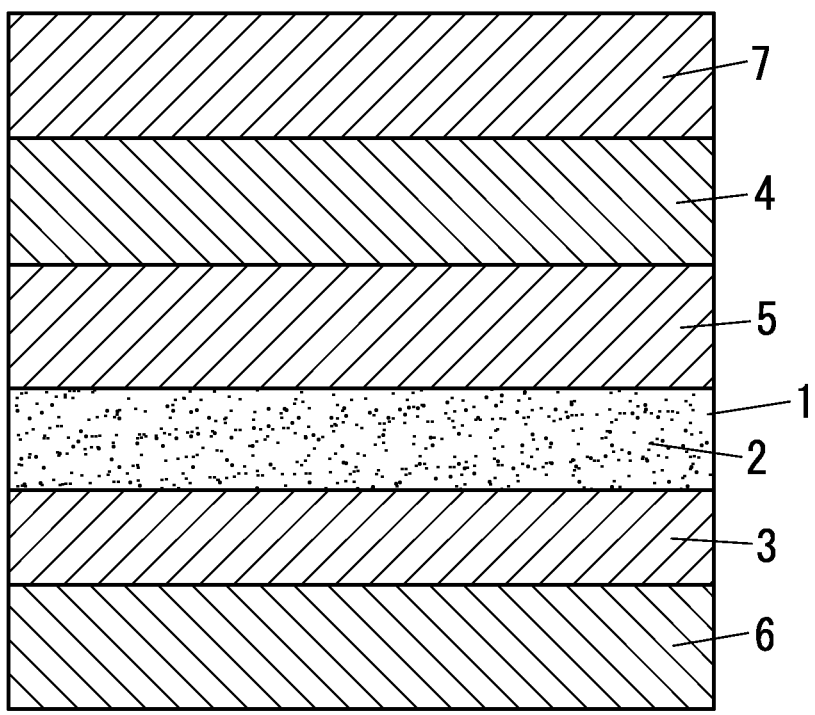

PHOTOELECTRIC ELEMENT

TECHNICAL FIELD

The present invention relates to a photoelectric element converting light into electricity.

BACKGROUND ART

In recent years, power generation devices using photovoltaic conversion, such as a photovoltaic cell and a solar cell, sensor devices sensing, for example, temperature and light, and other devices employ photoelectric elements (photoelectric conversion elements).

The photoelectric element includes an electron transport layer, which is required to have high electron transport properties. In the electron transport layer, it is important that energy from the outside generates electrons, and further the area of the reaction interface on which the electrons poured from the outside are reacted is an important factor. Such an electron transport layer has been formed of, for example, a metal, an organic semiconductor, an inorganic semiconductor, an electrically conductive polymer, and an electrically conductive carbon.

For example, in a photoelectric conversion element, the electron transport layer for transporting electrons is formed of an organic substance capable of carrying electrons, such as a fullerene, a perylene derivative, a poly(phenylene vinylene) derivative, and pentacene. This has been improving the electron transport capacity of the electron transport layer, thereby improving the conversion efficiency of the photoelectric conversion element (see Non-Patent Literature 1 for fullerenes, see Non-Patent Literature 2 for perylene derivatives, see Non-Patent Literature 3 for poly(phenylene vinylene) derivatives, and see Non-Patent Literature 4 for pentacene).

A molecular device type solar cell was also reported. In the solar cell, a structure in which an electron-donating molecule (donor) is chemically bonded to an electron-accepting molecule (acceptor) is formed as a thin film on a substrate (see Non-Patent Literature 5).

CITATION LIST

Non-Patent Literatures

Non-Patent Literature 1: P. Peumans, Appl. Phys. Lett., No. 79, p. 126, 2001
Non-Patent Literature 2: C. W. Tang, Appl. Phys. Lett., No. 48, p. 183, 1986
Non-Patent Literature 3: S. E. Shaheen, Appl. Phys. Lett., No. 78, p. 841, 2001
Non-Patent Literature 4: J. H. Schon, Nature (London), No. 403, p. 408, 2000
Non-Patent Literature 5: Hiroshi Imahori, Toshikazu Fukuzumi, "Prospects of Molecular Solar Cells", Kagaku Kogyo, July, p. 41, 2001

SUMMARY OF INVENTION

Technical Problem

The electron transport layer reported in each Non-Patent Literature unfortunately fails to satisfy both sufficient electron transport properties and sufficient interface area for working as the electron transport layer. On this account, there is a demand for an electron transport layer that has better electron transport properties and a sufficiently large interface, for electron transport, at present.

For example, in an organic electron transport layer including a fullerene or other substances, electric charges are likely to be recombined and effective diffusion distance is insufficient. Such an electron transport layer is difficult to obtain further improved conversion efficiency. The effective diffusion distance is a distance from the point at which charges are separated to an electrode. A device having a larger effective diffusion distance achieves higher conversion efficiency. An electron transport layer including an inorganic substance such as titanium oxide has an insufficient interface area for charge separation, and constituent elements unequivocally determine electron conduction potential that affects an open circuit voltage. Thus, such an electron transport layer has insufficient conversion efficiency.

In view of the above circumstances, the present invention has an object to provide a photoelectric element that includes an electron transport layer having excellent electron transport properties and a sufficiently large reaction interface and has low resistance loss and excellent conversion efficiency between light and electricity.

Solution to Problem

A photoelectric element of the present invention includes a first electrode, a second electrode, an electron transport layer and a hole transport layer interposed between the first electrode and the second electrode, an electrolyte solution, and a sensitizing dye.

The electron transport layer includes an organic compound having an oxidation-reduction site capable of repeated oxidation-reduction. The electrolyte solution serves to stabilize a reduction state of the oxidation-reduction site. The organic compound and the electrolyte solution form a gel layer. The sensitizing dye is in contact with the electron transport layer. The hole transport layer contains a charge transporter serving to reduce an oxidized form of the sensitizing dye and having a number average molecular weight of 2,000 or more and 100,000 or less.

It is preferable that the charge transporter be a polymer of a stable radical compound. It is preferable that the charge transporter be a polymer of a nitroxide radical compound. It is preferable that the charge transporter be poly(tetramethylpiperidinoxy)methacrylate. It is preferable that the electrolyte solution be an aqueous solution and the charge transporter be a water-soluble polymer of a nitroxide radical compound having an organic acid salt or an organic base salt. It is preferable that the electron transport layer contain at least one of an imide derivative, a quinone derivative, a viologen derivative, and a phenoxyl derivative.

Advantageous Effects of Invention

The present invention can provide a photoelectric element that includes an electron transport layer having excellent electron transport properties and a sufficiently large reaction interface and has low resistance loss and excellent conversion efficiency between light and electricity.

BRIEF DESCRIPTION OF DRAWINGS

FIG. 1 is a cross-sectional view showing an example of an embodiment of a photoelectric element of the present invention.

DESCRIPTION OF EMBODIMENTS

As shown in FIG. 1, a photoelectric element includes an electron transport layer 1 and a hole transport layer 5 that are interposed between a pair of electrodes 3 and 4 (a first electrode 3 and a second electrode 4). The electron transport layer 1 includes an organic compound having an oxidation-reduction site capable of repeated oxidation-reduction. To the organic compound, adding an electrolyte solution that stabilizes a reduction state of the oxidation-reduction site causes the organic compound to swell, thereby forming a gel layer 2.

A sensitizing dye is in contact with the electron transport layer 1. The sensitizing dye is a dye serving as a photosensitizer and is changed into an oxidized form by photosensitization reaction.

The hole transport layer 5 contains a charge transporter that serves to reduce the oxidized form of the sensitizing dye. The charge transporter is a polymer having a number average molecular weight of 2,000 or more and 100,000 or less.

Forming the gel layer 2 from the organic compound and the electrolyte solution in the electron transport layer 1 in the aforementioned manner enlarges a reaction interface. In addition, the oxidized form of the sensitizing dye that is in contact with the electron transport layer 1 is immediately reduced by the charge transporter in the hole transport layer 5. This can increase the speed of oxidation-reduction cycle of the sensitizing dye. Such a structure improves the conversion efficiency between light and electricity by the photoelectric element.

The sensitizing dye is in contact with the electron transport layer 1, and the sensitizing dye may be immobilized by physical or chemical action to the organic compound included in the gel layer 2. In such a case, a closer distance between the sensitizing dye and the organic compound improves the electron transport efficiency between the sensitizing dye and the organic compound. The sensitizing dye being in contact with the electron transport layer 1 includes the state in which the sensitizing dye is present in the interface region between the electron transport layer 1 and the hole transport layer 5.

FIG. 1 is an example of an embodiment of the photoelectric element. In the photoelectric element, a pair of substrates 6 and 7 (a first substrate 6 and a second substrate 7) are arranged opposite to each other. The first electrode 3 is placed on the inside surface of the first substrate 6. The second electrode 4 is placed on the inside surface of the second substrate 7. The first electrode 3 and the second electrode 4 face each other. Provided on the surface of the first electrode 3 opposite to the first substrate 6 is an electron transport layer 1. The electron transport layer 1 may be in contact with the first electrode 3. Provided on the surface of the second electrode 4 opposite to the second substrate 7 is a hole transport layer 5. The hole transport layer 5 may be in contact with the second electrode 4. The electron transport layer 1 is formed of an organic compound having an oxidation-reduction site. The organic compound and an electrolyte solution in the electron transport layer 1 form a gel layer 2.

The first electrode 3 is formed through depositing an electrically conductive material on the insulating first substrate 7 formed of, for example, glass or an optically transparent film. The first electrode 3 may be formed of a film made of metal alone. Preferred examples of the electrically conductive material include metal such as platinum, gold, silver, copper, aluminum, rhodium, and indium; carbon; electrically conductive metal oxides such as an indium-tin composite oxide, tin oxide doped with antimony, and tin oxide doped with fluorine; composites of the metals and the compounds; and materials obtained by coating the metals and the compounds with, for example, silicon oxide, tin oxide, titanium oxide, zirconium oxide, and aluminum oxide. The electrode 4 preferably has a smaller surface resistance and the surface resistance is preferably 200Ω/□ or less and more preferably 50Ω/□ or less. The lower limit of the surface resistance is not particularly limited but is typically 0.1Ω/□.

For a first substrate 6 on which the first electrode 3 is formed and that is required to transmit light, the first substrate 6 desirably has a high light transmittance. In such a case, the first substrate 6 preferably has a light transmittance of 50% or more, and more preferably 80% or more at a wavelength of 500 nm. The first electrode 3 preferably has a thickness in a range of 0.1 to 10 µm. A thickness within this range enables easy formation of the first electrode 3 having a uniform thickness and also suppresses the reduction in the light transmittance of the first electrode 3. This allows sufficient light to enter the photoelectric element through the first electrode 3.

For a first electrode 3 formed of an optically transparent electrically conductive oxide layer on the first substrate 6, the first electrode 3 may be formed through a vacuum process such as sputtering and depositing on an optically transparent first substrate 6 formed of, for example, glass or a resin. Alternatively, the first electrode 3 may be formed of a layer of an optically transparent electrically conductive oxide (e.g., indium oxide, tin oxide, and zinc oxide) formed through a wet process (e.g., spin coating, spraying, and screen printing).

The second electrode 4 serves as the positive electrode of the photoelectric element. The second electrode 4 is formed by lamination of an electrically conductive material on the second substrate 7, for example. The second electrode 4 may be formed of a film made of metal alone. The material for forming the second electrode 4 depends on the type of a photoelectric element including the second electrode 4 and examples of the material include metals such as platinum, gold, silver, copper, aluminum, rhodium, and indium; carbon materials such as graphite, carbon nanotubes, and platinum supported on carbon; electrically conductive metal oxides such as an indium-tin composite oxide, tin oxide doped with antimony, and tin oxide doped with fluorine; and electrically conductive polymers such as polyethylenedioxythiophene, polypyrrole, and polyaniline. The method for forming the second electrode 4 on the second substrate 7 may be a method similar to that for forming the first electrode 3 on the first substrate 6.

The second substrate 7 can be formed of the same material as that for the first substrate 6. A second substrate 7 on which the second electrode 4 is formed may be optically transparent or not. To provide the photoelectric element which allows external light to enter inside via the electron transport layer 1 and also allows external light to enter inside via the hole transport layer 5, the second substrate 7 is preferably optically transparent. The light transmittance of the second substrate 7 can be set in a similar manner to the light transmittance of the first substrate 6.

The electron transport layer 1 includes an organic compound. The molecule of the organic compound has an oxidation-reduction site capable of repeated oxidation-reduction and also has a site (hereinafter also called gel site) that turns into a gel when containing an electrolyte solution and swelling. The oxidation-reduction site is chemically bonded to the gel site. The positional relation between the oxidation-reduction site and the gel site in the molecule is not particularly limited. For example, in a molecule having the gel site that constitutes a molecular framework such as a main chain, the oxidation-reduction site is a side chain that is bonded to the main chain. A molecular framework forming the gel site may be alternately bonded to a molecular framework forming the oxidation-reduction site. In such a case in which both the oxidation-reduction site and the gel site are present in the same molecule, the gel layer 2 can hold the oxidation-reduction site so as to remain at a position at which the oxidation-reduction site readily transport electrons.

The organic compound having an oxidation-reduction site and a gel site may have a low molecular weight or a high molecular weight. A usable organic compound having a low molecular weight may be an organic compound that forms what is called a low molecular weight gel through a hydrogen bond and other factors. The organic compound having a high molecular weight preferably has a number average molecular weight of 1,000 or more because such a compound can spontaneously exhibit the gelation function. The upper limit of the molecular weight of the organic compound having a high molecular weight is not particularly limited and is preferably 1,000,000 or less. Preferred examples of the gel state of the gel layer 2 include, but are not necessarily limited to, a konjac jelly form and an ion exchange film form in external appearance.

The oxidation-reduction site means a site that is reversibly converted into an oxidized form and a reduced form through oxidation-reduction reaction. The oxidation-reduction site may be a site that constitutes a pair of oxidation-reduction system including an oxidized form and a reduced form and is not particularly limited. The oxidized form and the reduced form preferably have the same charge number.

Known as a physical index affecting the size of the reaction interface in the gel layer 2 is the degree of swelling. As used herein, the degree of swelling is represented by the equation below.

Degree of swelling=(weight of gel)/(weight of dried gel)×100

The dried gel means the gel layer 2 after dried. The drying the gel layer 2 means removal of a solution included in the gel layer 2, especially, removal of a solvent. Examples of the method for drying the gel layer 2 include heating the gel layer 2, removing a solution or a solvent in a vacuum environment, and removing a solution or a solvent included in the gel layer 2 by using another solvent.

For the removal of a solution or a solvent included in the gel layer 2 by using another solvent, selecting a solvent that has high affinity to the solution or the solvent included in the gel layer 2 and can be removed by heat or in a vacuum environment allows the solution or the solvent included in the gel layer 2 to be efficiently removed.

The gel layer 2 preferably has a degree of swelling of 110 to 3,000% and more preferably 150 to 500%. A gel layer 2 having a degree of swelling of less than 110% contains an electrolyte component in a small amount, and thus the oxidation-reduction site may be insufficiently stabilized. A gel layer 2 having a degree of swelling of more than 3,000% contains the oxidation-reduction site in a small amount, and this may reduce the electron transport capacity. Each case degrades the characteristics of the photoelectric element.

The organic compound having the oxidation-reduction site and the gel site in the same molecule as above can be represented by the general formula below.

$(X_i)_{nj}:Y_k$ $(X_i)_n$ represents the gel site and $X_i$ represents a monomer of a compound constituting the gel site. The gel site can be formed of a polymer framework. The degree n of polymerization of a monomer preferably ranges from 1 to 100,000. Y is an oxidation-reduction site bonded to $(X_i)_n$. j and k are arbitrary integers representing the numbers of $(X_i)_n$ and Y in a molecule, respectively, and each preferably ranges from 1 to 100,000. The oxidation-reduction site Y may be bonded to any site in the polymer framework constituting the gel site $(X_i)_n$. The oxidation-reduction site Y may contain various sites, and such a site preferably has a similar oxidation-reduction potential from the viewpoint of electron exchange reaction.

Examples of such an organic compound having an oxidation-reduction site Y and a gel site $(X_i)_n$ in the same molecule include a polymer having a quinone derivative framework formed of chemically bonded quinones, a polymer having an imide derivative framework containing imides, a polymer having a phenoxyl derivative framework containing phenoxyls, and a polymer having a viologen derivative framework containing viologens. In these organic compounds, each polymer framework serves as the gel site and each of the quinone derivative framework, the imide derivative framework, the phenoxyl derivative framework, and the viologen derivative framework serves as the oxidation-reduction site.

Among the organic compounds, examples of the polymer having a quinone derivative framework formed of chemically bonded quinones include polymers having chemical structures of [Chemical Formula 1] to [Chemical Formula 4]. In [Chemical Formula 1] to [Chemical Formula 4], R is saturated or unsaturated hydrocarbons such as methylene, ethylene, propane-1,3-dienyl, ethylidene, propane-2,2-diyl, alkanediyl, benzylidene, propylene, vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; and groups formed by substitution of the terminal thereof and composite groups thereof.

[Chemical Formula 1] is an example of the organic compound formed by chemical bonding of an anthraquinone to a polymer main chain. [Chemical Formula 2] is an example of the organic compound formed by integration of an anthraquinone as a repeated unit into a polymer main chain. [Chemical Formula 3] is an example of the organic compound including an anthraquinone as a cross-linking unit. [Chemical Formula 4] is an example of the anthraquinone having a proton donating group that forms an intermolecular hydrogen bond together with an oxygen atom.

[Chemical Formula 1]

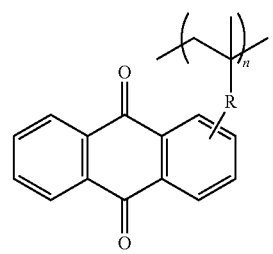

[Chemical Formula 2]

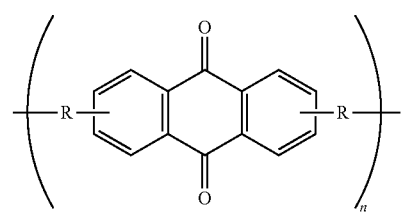

[Chemical Formula 3]

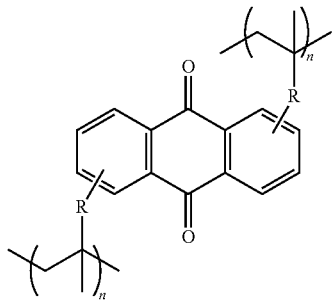

[Chemical Formula 4]

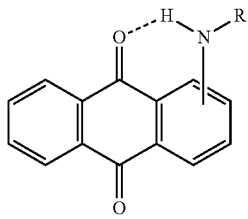

The quinone polymer is capable of high speed redox reaction whose rate is not determined by proton transfer, has no electronic interaction with a quinone group as the redox site (oxidation-reduction site), and has chemical stability to be usable for a long period of time. In addition, the quinone polymer is not dissolved in an electrolyte solution and thus has an advantage because holding the quinone polymer on the first electrode 3 enables the formation of the electron transport layer 1.

Examples of the polymer having an imide derivative framework containing imides include polyimides represented by [Chemical Formula 5] and [Chemical Formula 6]. In [Chemical Formula 5] and [Chemical Formula 6], each $R_1$ to $R_3$ is: an aromatic group such as a phenylene group; an aliphatic chain such as an alkylene group and an alkyl ether; or an ether group. The polyimide polymer framework may be cross-linked at the sites of $R_1$ to $R_3$ but may have no cross-linked structure as long as the polyimide polymer framework merely swells in a solvent and is not dissolved. In a cross-linked polymer, the cross-linked moiety corresponds to the gel site $(X_i)_n$. In a polyimide polymer framework with a cross-linked structure, the cross-linking unit may contain an imido group. A suitably used imido group is exemplified by phthalimide and pyromellitimide having electrochemically reversible oxidation-reduction properties.

[Chemical Formula 5]

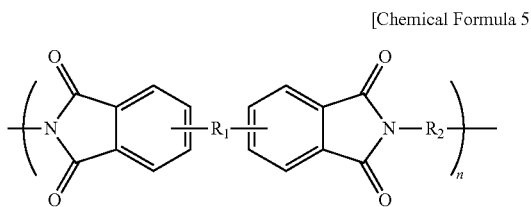

[Chemical Formula 6]

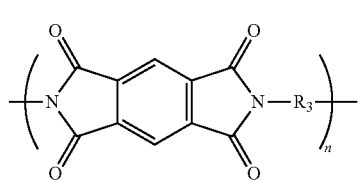

Examples of the polymer having a phenoxyl derivative framework containing phenoxyls include a galvi compound (galvi polymer) as represented by [Chemical Formula 7]. In the galvi compound, the galvinoxyl group (see [Chemical Formula 8]) corresponds to the oxidation-reduction site Y, and the polymer framework corresponds to the gel site $(X_i)_n$.

[Chemical Formula 7]

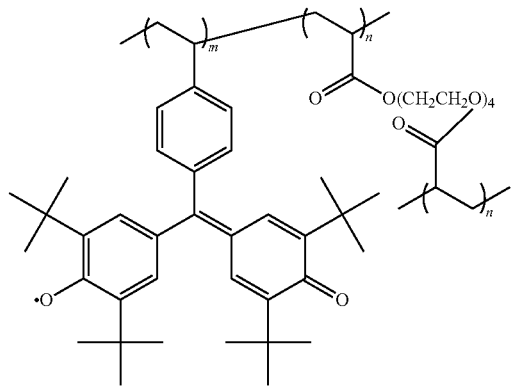

[Chemical Formula 8]

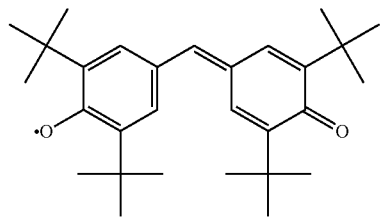

Examples of the polymer having a viologen derivative framework containing viologens include polyviologen polymers as represented by [Chemical Formula 9] and [Chemical Formula 10]. In the polyviologen polymer, the moiety represented by [Chemical Formula 11] corresponds to the oxidation-reduction site Y, and the polymer framework corresponds to the gel site $(X_i)_n$.

[Chemical Formula 9]

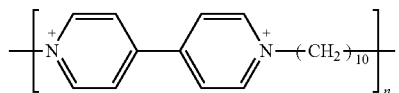

[Chemical Formula 10]

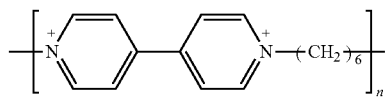

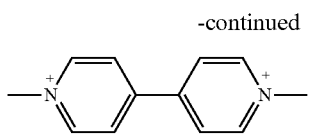
[Chemical Formula 11]

In [Chemical Formula 1] to [Chemical Formula 3], [Chemical Formula 5] to [Chemical Formula 7], [Chemical Formula 9], and [Chemical Formula 10], m and n are the degree of polymerization of a monomer, and the value preferably ranges from 1 to 100,000.

Thus, the electron transport layer 1 in the photoelectric element preferably contains, as the organic compound, at least one of the imide derivative, the quinone derivative, the viologen derivative, and the phenoxyl derivative.

As described above, a space in the polymer framework of the organic compound having the oxidation-reduction site and the gel site as the polymer framework contains an electrolyte solution, and then the polymer swells thereby to form a gel layer 2. The electron transport layer 1 formed of the organic compound contains an electrolyte solution in this manner, and this compensates an ionic state formed by oxidation-reduction reaction of the oxidation-reduction site with a counter ion in the electrolyte solution, thereby stabilizing the oxidation-reduction site.

The electrolyte solution may contain an electrolyte and a solvent. The electrolyte is one or both of a supporting salt and a pair of oxidation-reduction components including an oxidized form and a reduced form. Examples of the supporting salt (supporting electrolyte) include ammonium salts such as tetrabutylammonium perchlorate, tetraethylammonium hexafluorophosphate, an imidazolium salt, and a pyridinium salt; and alkali metal salts such as lithium perchlorate and potassium tetrafluoroborate. The oxidation-reduction component means a pair of substances reversibly converted into an oxidized form and a reduced form by oxidation-reduction reaction. Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion. These oxidation-reduction components serve independent to the oxidation-reduction site in the electron transport layer 1. The electrolyte solution may be in a gel form or in an immobilized form as described above.

The solvent included in the electrolyte solution contains at least one of water, an organic solvent, and an ionic liquid.

Using water or an organic solvent as a solvent in the electrolyte solution stabilizes a reduction state of the oxidation-reduction site of the organic compound, and this enables more stable transportation of electrons. The solvent to be used may be water or an organic solvent and is preferably an organic solvent having excellent ionic conductivity in order to further stabilize the oxidation-reduction site. Examples of such an organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyl-tetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. These solvents may be used singly or in combination as a mixture of two or more of them. Among them, from the viewpoint of improving solar cell output characteristics by using a photoelectric element as a photoelectric conversion element, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred.

Using an ionic liquid as a solvent in the electrolyte solution stabilizes the oxidation-reduction site. In addition, an ionic liquid, which has no volatility and has high flame retardancy, is excellent in stability. As the ionic liquid, known general ionic liquids can be used and examples include an imidazolium ionic liquid such as 1-ethyl-3-methylimidazolium tetracyanoborate, a pyridine ionic liquid, an alicyclic amine ionic liquid, an aliphatic amine ionic liquid, an azonium amine ionic liquid, and ionic liquids described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

The gel layer 2 formed of an organic compound having the oxidation-reduction site and an electrolyte solution as above is provided on the surface of the electrode 4, thereby the electron transport layer 1 being formed. In the electron transport layer 1 formed in this manner, electrons serve as a dopant. For example, the electron transport layer 1 has an oxidation-reduction site having a positive oxidation-reduction potential higher than +100 mV with respect to the silver/silver chloride reference electrode 4.

The electron transport layer 1 preferably has a thickness ranging from 10 nm to 10 mm in order to maintain good electron transport properties. The thickness is particularly preferably 100 nm to 100 μm. Such a thickness allows the electron transport layer 1 to satisfy both good electron transport properties and a larger interface area.

For the formation of the electron transport layer 1 on the surface of the electrode 4, a wet formation process by applying, for example, a solution to form the electron transport layer 1 is preferred because the production process is simpler and inexpensive. Especially for an electron transport layer 1 formed of what is called a high molecular weight organic compound having a number average molecular weight of 1,000 or more, the wet process is preferred from the viewpoint of formability. Examples of the wet process include spin coating, drop casting in which a liquid is dropped and dried, and printing such as screen printing and gravure printing. In addition, vacuum processes such as sputtering and depositing can be employed.

The sensitizing dye serves as a photosensitizer that efficiently absorbs visible light and near infrared light. The sensitizing dye is in contact with the electron transport layer 1, and such a sensitizing dye may be on the interface between the electron transport layer 1 and the hole transport layer 5. The organic compound having an oxidation-reduction site in the electron transport layer 1 swells with the electrolyte solution to form the gel layer 2, and the hole transport layer 5 is formed of a similar electrolyte solution. Hence, the electrolyte solution contained in the gel layer 2 also constitutes a part of the hole transport layer 5. Thus, attachment, adsorption, or bonding of the sensitizing dye onto the surface of the organic compound constituting the electron transport layer 1 allows the sensitizing dye to be present in the gel layer 2, and accordingly the sensitizing dye is on the interface between the electron transport layer 1 and the hole transport layer 5. With providing the sensitizing dye as mentioned above, a dye sensitized photoelectric conversion element is produced.

The sensitizing dye may be known materials and examples thereof include a 9-phenylxanthene dye, a coumarin dye, an acridine dye, a triphenylmethane dye, a tetraphenylmethane dye, a quinone dye, an azo dye, an indigo dye, a cyanine dye, a merocyanine dye, and a xanthene dye. Examples of the sensitizing dye further include a $RuL_2(H_2O)_2$ type ruthenium-cis-diaqua-bipyridyl complex (where L is 4,4'-dicarboxyl-2,2'-bipyridine), transition-metal complexes such as ruthenium-tris ($RuL_3$), ruthenium-bis($RuL_2$), osmium-tris ($OsL_3$), and osmium-bis($OsL_2$), zinc-tetra(4-carboxyphenyl) porphyrin, an iron-hexacyanide complex, and phthalocyanine. Other applicable examples of the sensitizing dye include dyes described in the chapter, DSSC, in "Advanced Technology and Material Development of FPD, DSSC, Optical Memory, and Functional Dye" (NTS Inc.). Among them, a dye capable of association is preferred because such a dye accelerates charge separation during photovoltaic conversion. The dye forming association and giving an advantage is preferably a dye having the structure represented by [Chemical Formula 12], for example.

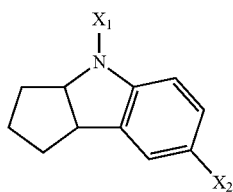

[Chemical Formula 12]

In the above structural formula, $X_1$ and $X_2$ are an organic group having at least one of an alkyl group, an alkenyl group, an aralkyl group, an aryl group, and a hetero ring, and each may have a substituent. The dye as represented by [Chemical Formula 12] is known to be associative. Such a dye markedly reduces the recombination of electrons and holes present in the electron transport layer 1 and the hole transport layer 5, and this improves the conversion efficiency of an photoelectric conversion element to be obtained.

The sensitizing dye in contact with the electron transport layer 1 may be immobilized on the surface or in the inside of the gel layer 2 by a physical or chemical action to the organic compound included in the gel layer 2. The sensitizing dye may also be present in the gel layer 2, and especially in the case, the sensitizing dye may be homogeneously present in the gel layer 2.

"Sensitizing dye present in the gel layer 2" means that the sensitizing dye is present not only in the surface layer of the gel layer 2 but also in the inside. This allows the gel layer 2 to constantly contain the sensitizing dye in a predetermined amount or more. Hence, the output power improvement effect of the photoelectric element can be achieved.

"The state in which the sensitizing dye is present in the gel layer 2" includes "the state in which the sensitizing dye is present in the electrolyte solution included in the gel layer 2" and "the state in which the sensitizing dye physically or chemically interacts with the organic compound included in the gel layer 2 thereby to be held in the gel layer 2".

"The state in which the sensitizing dye physically interacts with the organic compound included in the gel layer 2 thereby to be held in the gel layer 2" is, for example, the state in which using, as the organic compound included in the gel layer 2, an organic compound having a structure that prevents the sensitizing dye molecule from transferring in the gel layer 2 prevents the sensitizing dye molecule from transferring in the gel layer 2. Examples of the structure preventing the sensitizing dye molecule from transferring include a structure in which various molecular chains of the organic compound, such as an alkyl chain, exhibit steric hindrance and a structure in which a void space present in molecular chains of the organic compound is so small as to prevent the sensitizing dye molecule from transferring.

It is also effective to add a factor exhibiting physical interaction to the sensitizing dye. Effective examples are specifically adding the structure exhibiting steric hindrance due to various molecular chains such as an alkyl chain to the sensitizing dye and bonding two or more sensitizing dye molecules. In order to bond the sensitizing dye molecules to each other, it is effective to use saturated hydrocarbons such as methylene, ethylene, propane-1,3-dienyl, ethylidene, propane-2,2-diyl, alkanediyl, benzylidene, and propylene; unsaturated hydrocarbons such as vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; and groups formed by substitution of the terminal thereof and composite groups thereof. The moiety is desirably bonded to the sensitizing dye through an optionally substituted, straight or branched alkyl group such as methyl, ethyl, i-propyl, butyl, t-butyl, octyl, 2-ethylhexyl, 2-methoxyethyl, benzyl, trifluoromethyl, cyanomethyl, ethoxycarbonylmethyl, propoxyethyl, 3-(1-octylpyridinium-4-yl)propyl, and 3-(1-butyl-3-methylpyridinium-4-yl)propyl and an optionally substituted, straight or branched alkenyl group such as vinyl and allyl.

"The state in which the sensitizing dye chemically interacts with the organic compound included in the gel layer 2 thereby to be held in the gel layer 2" is, for example, the state in which the sensitizing dye is held in the gel layer 2 by a covalent bond, a coordinate bond, an ionic bond, a hydrogen bond, a van der Waals bond, and a chemical interaction such as a hydrophobic interaction, a hydrophilic interaction, and an electrostatic interaction between the sensitizing dye and the organic compound. The immobilization of the sensitizing dye in the gel layer 2 by such a chemical interaction between the sensitizing dye and the organic compound included in the gel layer 2 decreases the distance between the sensitizing dye and the organic compound, and this allows electrons to more efficiently move.

In a gel layer 2 in which the sensitizing dye is immobilized by the chemical interaction between the organic compound and the sensitizing dye, the organic compound and the sensitizing dye preferably include appropriate functional groups, through which the sensitizing dye is immobilized to the organic compound by chemical reaction, for example. Such functional groups may include a hydroxy group, a carboxyl group, a phosphate group, a sulfo group, a nitro group, an alkyl group, a carbonate group, an aldehyde group, and a thiol group. Examples of the reaction manner for the chemical reaction through the functional group include condensation reaction, addition reaction, and ring-opening reaction.

For the chemical bonding between the sensitizing dye and the organic compound included in the gel layer 2, a functional group in the sensitizing dye is preferably introduced to the vicinity of a site having an increased electron density in a photoexcited sensitizing dye and a functional group of the organic compound in the gel layer 2 is preferably introduced to the vicinity of a site contributing electron transport in the organic compound. This improves the electron transfer efficiency from the sensitizing dye to the organic compound and the electron transport efficiency in the organic compound. In particular, in a photoelectric element in which the sensitizing dye and the organic compound included in the gel layer 2 are bonded through a linking group that bonds an electron cloud of the sensitizing dye and an electron cloud of the organic compound and that provides high electron transport properties, electrons can more efficiently move from the sensitizing dye to the organic compound. Usable examples of the chemical bond bonding a π electron cloud of the sensitizing dye to a π electron cloud of the organic compound specifically include an ester linkage having a π electron system.

The sensitizing dye may be bonded to the organic compound when the organic compound is in a monomer state, the organic compound is polymerized, or the organic compound is gelled after polymerization of the organic compound or after the organic compound is gelled. Examples of the specific technique include a method of immersing an electron transport layer 1 formed of the organic compound in a bath containing the sensitizing dye and a method of applying a coating solution containing the organic compound and the sensitizing dye to an electrode 4 to form an electron transport layer 1 as a film. Alternatively, a combination of these methods can be used.

In a photoelectric element in which the sensitizing dye is immobilized by physical or chemical action to the organic compound included in the gel layer 2 as above, the electron transport efficiency between the sensitizing dye and the organic compound is improved with a decrease in a distance between the sensitizing dye and the organic compound.

The amount of the sensitizing dye in the gel layer 2 is appropriately set. In particular, a sensitizing dye contained in an amount of 0.1 part by mass or more with respect to 100 parts by mass of the organic compound gives a sufficiently large amount of the sensitizing dye per unit film thickness of the gel layer 2. This improves light absorption capacity of the sensitizing dye, thereby affording a high current value. In particular, a sensitizing dye contained in an amount of 1,000 parts by mass or less with respect to 100 parts by mass of the organic compound suppresses an excess amount of the sensitizing dye present in the organic compound. This suppresses the interference with electron transfer in the organic compound by the sensitizing dye, thereby ensuring high electric conductivity.

Examples of the material for forming the hole transport layer 5 include: an electrolyte solution formed by dissolving an electrolyte such as a redox couple in a solvent; a solid electrolyte such as a molten salt; a p-type semiconductor such as copper iodide; an amine derivative such as triphenylamine; and an electrically conductive polymer such as polyacetylene, polyaniline, and polythiophene.

For a hole transport layer 5 formed of an electrolyte solution, an electrolyte solution included in the gel layer 2 may be used to form the hole transport layer 5. In such a case, the electrolyte solution included in the gel layer 2 constitutes a part of the hole transport layer 5.

The electrolyte solution may be held by a polymer matrix. Examples of a polyvinylidene fluoride polymer compound used as the polymer matrix include a homopolymer of vinylidene fluoride and a copolymer of vinylidene fluoride and an additional polymerizable monomer (suitably a radical polymerizable monomer). Specific examples of the additional polymerizable monomer (hereinafter called copolymerizable monomer) to be copolymerized with vinylidene fluoride include hexafluoropropylene, tetrafluoroethylene, trifluoroethylene, ethylene, propylene, acrylonitrile, vinylidene chloride, methyl acrylate, ethyl acrylate, methyl methacrylate, and styrene.

The hole transport layer 5 contains a charge transporter that serves to reduce an oxidized form of the sensitizing dye. The charge transporter is preferably a polymer, which has a number average molecular weight in a range of 2,000 to 100,000. A charge transporter having a number average molecular weight within this range can maintain a good charge separation interface to the sensitizing dye held in the gel layer 2 from a viewpoint of the excluded volume of a polymer and can also suppress the contact with the first electrode 3. From the above viewpoint, the charge transporter preferably has a number average molecular weight of 3,000 or more and 50,000 or less and more preferably 5,000 or more and 30,000 or less. The number average molecular weight can be determined by gel permeation chromatography, for example.

The charge transporter may employ at least one of a stable radical compound and a polymer thereof. In such a case, in a photoelectric element formed as a photoelectric conversion element, holes generated by charge separation on a reaction interface are efficiently transported from the hole transport layer 5 to the second electrode 4 by very rapid electron transfer reaction of the stable radical compound. This can improve the photovoltaic conversion efficiency of the photoelectric element.

As the stable radical compound, a chemical species having an unpaired electron, that is to say, a compound having a radical can be used without particular limitation. Specifically, a radical compound having nitroxide (NO.) in the molecule is preferred. For a stable radical compound as a polymer, the stable radical polymer preferably has a molecular weight (number average molecular weight) of 2,000 or more and 100,000 or less. A stable radical compound having a large molecular weight is preferred from the viewpoint of the stability of a device because such a compound is solid or is likely to be solid at ambient temperature and thus is unlikely to volatilize.

The stable radical compound will be further described. The stable radical compound is a compound that forms a radical compound in at least one process of an electrochemical oxidation reaction or an electrochemical reduction reaction. The type of the radical compound is not particularly limited but is preferably a stable radical compound. In particular, it is preferably a polymer of an organic compound containing one or both of the structural units of [Chemical Formula 13] and [Chemical Formula 14] below.

[Chemical Formula 13]

In [Chemical Formula 13], the substituent $R^1$ is a substituted or unsubstituted C2 to C30 alkylene group, C2 to C30 alkenylene group, or C4 to C30 arylene group; X is an oxy radical group, a nitroxyl radical group, a nitroxide radical group, a sulfur radical group, a hydrazyl radical group, a carbon radical group, or a boron radical group; and $n^1$ is an integer of 2 or more and is a value with which the molecular weight of the compound meets the range.

[Chemical Formula 14]

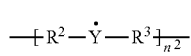

In [Chemical Formula 14], the substituents $R^2$ and $R^3$ are independent to each other and are a substituted or unsubstituted C2 to C30 alkylene group, C2 to C30 alkenylene group, or C4 to C30 arylene group; Y is a nitroxyl radical group, a sulfur radical group, a hydrazyl radical group, or a carbon radical group; and $n^2$ is an integer of 2 or more and is a value with which the molecular weight of the compound meets the aforementioned range.

Examples of the stable radical compound containing at least one of the structural units represented by [Chemical Formula 13] and [Chemical Formula 14] include an oxy radical compound, a nitroxyl radical compound, a nitroxide radical compound, a carbon radical compound, a nitrogen radical compound, a boron radical compound, and a sulfur radical compound.

Specific examples of the oxy radical compound include a polymer having an aryloxy radical compound represented by [Chemical Formula 15] and [Chemical Formula 16] below as a framework and a semiquinone radical compound as represented by [Chemical Formula 17].

[Chemical Formula 15]

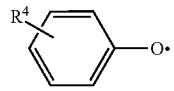

[Chemical Formula 16]

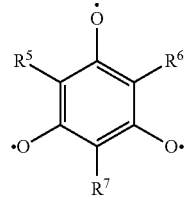

[Chemical Formula 17]

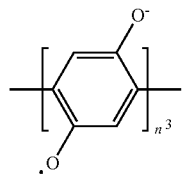

In the chemical formulae [Chemical Formula 15] to [Chemical Formula 17], the substituents $R^4$ to $R^7$ are independent to each other and are a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. However, in the chemical formulae [Chemical Formula 15] and [Chemical Formula 16], the substituents $R^4$ to $R^7$ have a polymerizable functional group. In the chemical formula [Chemical Formula 17], $n^3$ is an integer of 2 or more and is a value with which the molecular weight of the compound meets the aforementioned range.

Specific examples of the nitroxyl radical compound and the nitroxide radical compound include a polymer including a radical compound having a piperidinoxy ring as represented by [Chemical Formula 18] below as a framework, a polymer including a radical compound having a pyrrolidinoxy ring as represented by [Chemical Formula 19] as a framework, a polymer including a radical compound having a pyrrolinoxy ring as represented by [Chemical Formula 20] as a framework, and a polymer including a radical compound having a nitronyl nitroxide structure as represented by [Chemical Formula 21] as a framework.

[Chemical Formula 18]

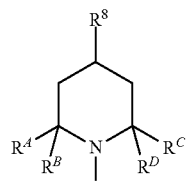

[Chemical Formula 19]

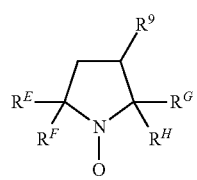

[Chemical Formula 20]

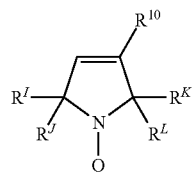

[Chemical Formula 21]

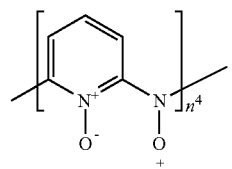

In the chemical formulae [Chemical Formula 18] to [Chemical Formula 20], each of $R^8$ to $R^{10}$ and $R^A$ to $R^L$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. However, in the chemical formulae [Chemical Formula 18] to [Chemical Formula 20], the substituents $R^8$ to $R^{10}$ or $R^A$ to $R^L$ have a polymerizable functional group. In the chemical formula [Chemical Formula 21], $n^4$ is an integer of 2 or more and is a value with which the molecular weight of the compound meets the range.

Specific examples of the nitrogen radical compound include a polymer including a radical compound having a trivalent hydrazyl group as represented by [Chemical Formula 22] below as a framework, a polymer including a radical compound having a trivalent verdazyl group as represented by [Chemical Formula 23] as a framework, and a polymer including a radical compound having an aminotriazine structure as represented by [Chemical Formula 24] as a framework.

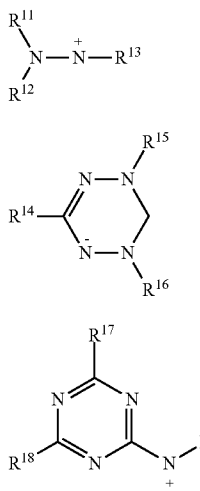

[Chemical Formula 22]

[Chemical Formula 23]

[Chemical Formula 24]

In the chemical formulae [Chemical Formula 22] to [Chemical Formula 24], each of $R^{11}$ to $R^{19}$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. However, in the chemical formulae [Chemical Formula 22] to [Chemical Formula 24], the substituents $R^{11}$ to $R^{19}$ have a polymerizable functional group.

Any of the radical compounds of [Chemical Formula 13] to [Chemical Formula 24] has a number average molecular weight in a range of 2,000 to 100,000. An organic polymer compound having a number average molecular weight within this range is excellent in stability. As a result, a photoelectric element can be stably used as a photoelectric conversion element or an energy storage device, and a photoelectric element having excellent stability and excellent response speed can be readily obtained. A radical compound having a number average molecular weight within the above range can maintain a good charge separation interface to the sensitizing dye held in the gel layer 2 from a viewpoint of the excluded volume of a polymer and can also suppress the contact with the first electrode 3. From this viewpoint, the radical compound preferably has a number average molecular weight of 3,000 or more and 50,000 or less and more preferably 5,000 or more and 30,000 or less.

Among the organic compounds above, an organic compound in a solid state at room temperature is more preferably selected to be used as the stable radical compound. This allows the radical compound to be stably in contact with the electron transport layer 1 and thus can suppress reforming and deterioration due to a side reaction with other chemical substances, melting, or diffusion. As a result, a photoelectric element having excellent stability can be obtained.

Among them, the charge transporter as a stable radical compound is preferably a polymer of a nitroxide radical compound. The polymer of a nitroxide radical compound is a polymer including a radical compound having a nitroxide structure as a framework. In this case, the charge transportation function can be improved.

A particularly preferred material for the charge transporter as the stable radical compound is PTMA (poly(tetramethylpiperidinoxy)methacrylate). PTMA can be obtained through a process of esterifying methacrylic chloride and 4-hydroxy TEMPO to yield a precursor monomer and of polymerizing and chemically oxidizing the precursor monomer. TEMPO is 2,2,6,6-tetramethylpiperidine-1-oxyl.

Examples of a preferred material for the charge transporter as the stable radical compound include a water-soluble polymer of a nitroxide radical compound having an organic acid salt or an organic base salt. In such a case, the electrolyte solution is preferably an aqueous solution. Such an aqueous solution can dissolve the water-soluble polymer of a nitroxide radical compound as a salt. Hence, the function as the charge transporter can be improved. A preferred water-soluble polymer of a nitroxide radical compound having an organic acid salt or an organic base salt is a polymer (copolymer) in which a polymer having a tetramethylpiperidinoxy group is bonded to a polymer having an organic acid salt or an organic base salt. Use of this allows a polymer having water-solubility to be more simply obtained. Specific examples of the water-soluble polymer of a nitroxide radical compound having an organic acid salt or an organic base salt include PTAM-PSS (poly(tetramethylpiperidinoxy)acrylamide-poly(sodium styrenesulfonate)). PTAM-PSS is a copolymer of a polyacrylamide having a tetramethylpiperidinoxy group and poly(sodium styrenesulfonate). In addition, usable examples of the polymer having a tetramethylpiperidinoxy group and the polymer having an organic acid salt or an organic base salt include a methacrylic or acrylic polymer, a vinyl polymer, an ester polymer, and a glycidyl ether polymer, which can yield a copolymer.

Preferred examples of the charge transporter as the polymer of a stable radical compound include PTVE (poly(tetramethylpiperidinoxy)vinyl ether), PTAm (poly(tetramethylpiperidinoxy)acrylamide, and PTGE (poly(tetramethylpiperidinoxy)glycidyl ether). As described above, a preferred polymer of a stable radical compound is a polymer having a tetramethylpiperidinoxy group.

The hole transport layer 5 preferably contains the charge transporter such as PTMA and PTAM-PSS in an amount in a range of 10% to 50% by mass based on the total amount of the hole transport layer 5. A charge transporter contained in the hole transport layer 5 within this range further improves the photovoltaic conversion characteristics. In order to add the charge transporter into the hole transport layer 5, the charge transporter may be dissolved or dispersed in an electrolyte solution for forming the hole transport layer 5.

To produce the photoelectric element, for example, an organic compound is deposited on the first electrode 3 provided on the first substrate 6 through a wet process or other processes to thus form the electron transport layer 1 that is fixed onto the first electrode 3. Subsequently, the hole transport layer 5 and the second electrode 4 are formed on the electron transport layer 1. For a hole transport layer 5 formed of an electrolyte solution, for example, in a state in which a sealer seals a space between the electron transport layer 1 and the second electrode 4, the space between the electron transport layer 1 and the second electrode 4 is filled with the electrolyte solution to form the hole transport layer 5. At this time, penetration of some of the electrolyte solution into the electron transport layer 1 allows an organic compound constituting the electron transport layer 1 to swell. Hence, the gel layer 2 can be formed.

In the photoelectric element formed as described above, forming the gel layer 2 from an organic compound and an electrolyte solution in the electron transport layer 1 enlarges the reaction interface. In addition, the oxidized form of a sensitizing dye that is in contact with the electron transport layer 1 is immediately reduced by a charge transporter in the hole transport layer 5. This can increase the speed of oxidation-reduction cycle of the sensitizing dye. Such a structure improves the conversion efficiency between light and electricity by the photoelectric element.

For example, applying light to a photoelectric element from the first substrate 6 side through the first electrode 3 causes the sensitizing dye to absorb the light and be excited. The excited electrons generated flow into the electron transport layer 1, then pass through the first electrode 3, and are taken out to the outside. Holes in the sensitizing dye are concurrently taken out from the hole transport layer 5 through the second electrode 4 to the outside.

At this time, forming the gel layer 2 from an organic compound and an electrolyte solution in the electron transport layer 1 sufficiently enlarges the reaction interface. In addition, the oxidized form of a sensitizing dye is immediately reduced by a charge transporter in the hole transport layer 5. Accordingly, the sensitizing dye is returned to a state capable of excitation. Then, the sensitizing dye absorbs light again and is excited, and electrons and holes are taken out to the outside again. Such an oxidation-reduction cycle of the sensitizing dye are continuously repeated at high speed. This improves the light absorption characteristics by the sensitizing dye and improves the conversion efficiency between light and electricity by the photoelectric element.

EXAMPLES

Example 1

In the reaction procedure shown in Scheme 1 below, a galvi compound was synthesized.

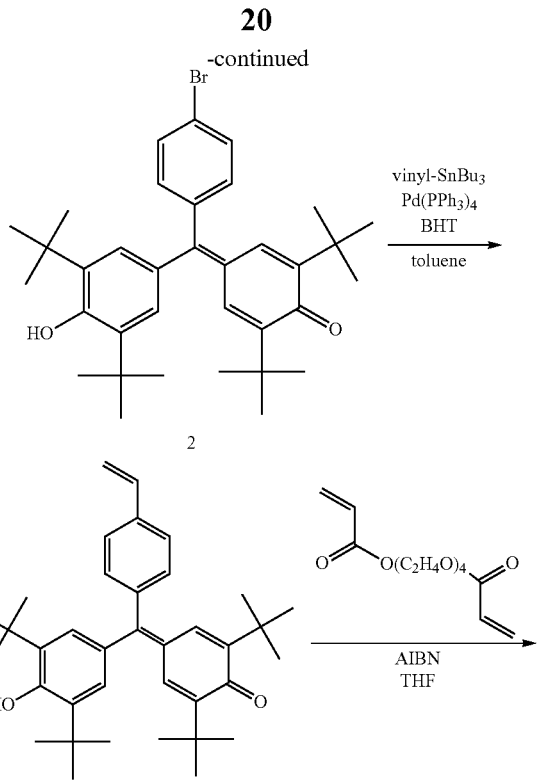

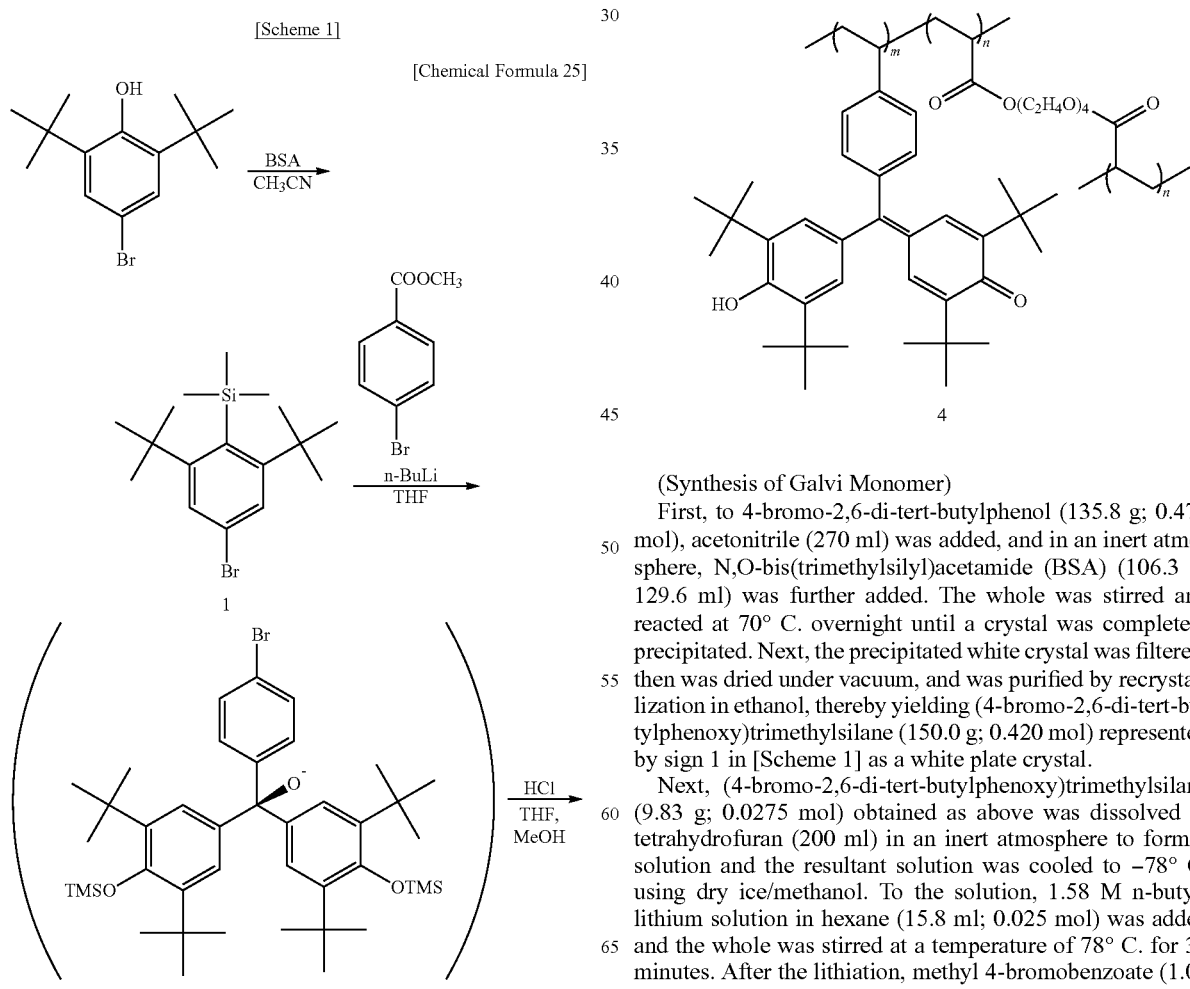

(Synthesis of Galvi Monomer)

First, to 4-bromo-2,6-di-tert-butylphenol (135.8 g; 0.476 mol), acetonitrile (270 ml) was added, and in an inert atmosphere, N,O-bis(trimethylsilyl)acetamide (BSA) (106.3 g; 129.6 ml) was further added. The whole was stirred and reacted at 70° C. overnight until a crystal was completely precipitated. Next, the precipitated white crystal was filtered, then was dried under vacuum, and was purified by recrystallization in ethanol, thereby yielding (4-bromo-2,6-di-tert-butylphenoxy)trimethylsilane (150.0 g; 0.420 mol) represented by sign 1 in [Scheme 1] as a white plate crystal.

Next, (4-bromo-2,6-di-tert-butylphenoxy)trimethylsilane (9.83 g; 0.0275 mol) obtained as above was dissolved in tetrahydrofuran (200 ml) in an inert atmosphere to form a solution and the resultant solution was cooled to −78° C. using dry ice/methanol. To the solution, 1.58 M n-butyl-lithium solution in hexane (15.8 ml; 0.025 mol) was added and the whole was stirred at a temperature of 78° C. for 30 minutes. After the lithiation, methyl 4-bromobenzoate (1.08 g; 0.005 mol, Mw: 215.0, TCI) dissolved in tetrahydrofuran (75 ml) was added thereto and the resultant mixture was stirred at −78° C. to room temperature overnight. The reaction solution was changed from yellow through pale yellow to dark blue that suggested the generation of an anion. After the reaction, a saturated aqueous ammonium chloride solution was added until the reaction solution was completely changed to yellow and then the mixture is subjected to extraction with ether/water to yield a yellow viscous liquid.

Then, this product was mixed with THF (10 ml) and methanol (7.5 ml) by a stirring bar to be dissolved therein. Next, 10 N HCl was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/chloroform=1/1), and recrystallization in hexane to be purified. Consequently, (p-bromophenyl)hydrogalvinoxyl (2.86 g; 0.0049 mol) represented by sign 2 in [Scheme 1] as an orange crystal was yielded.

Next, (p-bromophenyl)hydrogalvinoxyl (2.50 g; 4.33 mmol) obtained as above was dissolved in toluene (21.6 ml; 0.2 M) in an inert atmosphere. To the solution, 2,6-di-tert-butyl-p-cresol (4.76 mg; 0.0216 mmol), tetrakis(triphenylphosphine)palladium(0) (0.150 g; 0.130 mmol), tri-n-butylvinyltin (1.65 g; 5.20 mmol, Mw: 317.1, TCI) were immediately added, and the mixture was heated and stirred at 100° C. for 17 hours.

Then, the reaction product was extracted with ether/water, and the solvent was removed. The residue was fractionated by flash column chromatography (hexane/chloroform=1/3) and was further purified by recrystallization in hexane. Thereby, p-hydrogalvinoxylstyrene (1.54 g; 2.93 mmol) represented by sign 3 in [Scheme 1] was yielded as an orange microcrystal.

(Polymerization of Galvi Monomer)

In 2 ml of tetrahydrofuran, 1 g of the galvi monomer (p-hydrogalvinoxylstyrene) obtained in Synthesis of Galvi Monomer above, 57.7 mg of tetraethylene glycol diacrylate, and 15.1 mg of azobisisobutyronitrile were dissolved. Then, the solution was subjected to nitrogen substitution and was refluxed overnight. Thereby, the galvi monomer was polymerized to yield a galvi polymer represented by sign 4 in [Scheme 1]. The galvi polymer had a number average molecular weight of 10,000.

(Production of Semiconductor Device)

The substrate used was prepared through a process of forming an electrode of an optically transparent electrically conductive oxide as $SnO_2$ doped with fluorine on a surface of a glass substrate having a thickness of 1 mm (manufactured by ASAHI GLASS CO., LTD., 10Ω/□).

Then, 22.5 mg of the galvi polymer synthesized as above was dissolved in 4.5 ml of chloroform to form a solution, and the solution was applied onto the surface of the electrode by drop casting to form a film having a thickness of 100 nm.

Next, applying a voltage of 1.5 V or less to the electrode by energization allowed the galvi compound to be electrolytically oxidized to afford a radical. Thereby a semiconductor of a galvinoxyl radical polymer was formed on the surface of the electrode.

The resultant was set in a chamber for electrochemical measurement while a set of the electrode and the semiconductor formed thereon prepared as above was used as a work electrode, and a platinum wire electrode was used as a counter electrode, and a silver/silver chloride electrode was used as a reference electrode, and a lithium perchlorate solution was used as a supporting electrolyte solution. Then, the measurement was carried out by cyclic voltammetry, and a stable, reversible oxidation-reduction wave derived from the galvinoxyl radical was observed at 0 V with respect to the reference electrode. Thus, the result demonstrates n-type behavior. The quantity of electron of electrode reaction in the reduction process was substantially the same as the theoretical reaction quantity calculated from the number of radical sites (calculated from the coating amount), and thus quantitative reaction of the galvinoxyl radical polymer applied was revealed. Furthermore, the oxidation-reduction wave was stably observed even by repeated application of voltage (40 cycles). Thus, the result demonstrates stable behavior.

Next, onto the semiconductor formed as above, a saturated solution of D131 dye represented by [Chemical Formula 26] in acetonitrile was applied by spin coating and thus the sensitizing dye was supported to modify the semiconductor.

[Chemical Formula 26]

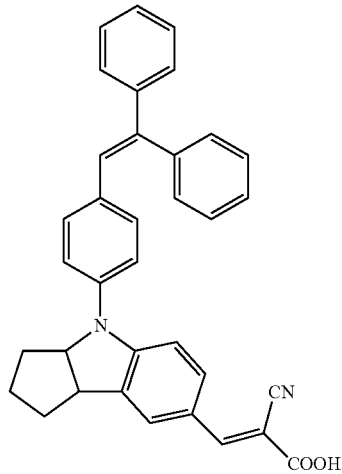

(Synthesis of PTMA)

In the reaction procedure shown in Scheme 2 below, PTMA was synthesized.

[Scheme 2]

[Chemical Formula 27]

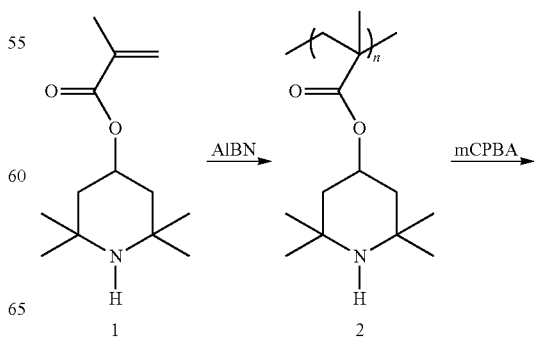

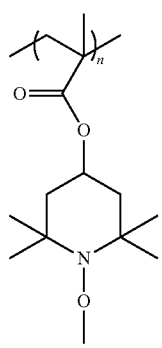

First, into a 300-ml three-necked recovery flask, 4-hydroxy-2,2,6,6-tetramethylpiperidine (4.71 g, 30 mmol), triethanolamine (8.9 ml, 64 mmol), and benzene (120 ml, 0.25 M) as a solvent were charged and the mixture was cooled at 0° C. under an argon atmosphere for 15 minutes. Next, to the mixture, methacrylic chloride (1.9 ml, 19.8 mmol, 0.66 eq.) was added and the mixture was further stirred in an argon stream at room temperature for 2 hours. The reaction solution was extracted (dichloromethane/aqueous calcium carbonate solution) and the dichloromethane layer was dried. The dichloromethane layer was fractionated by column chromatography (chloroform/methanol=5:1) and then was recrystallized (hexane), thereby a precursor monomer (sign 1 in [Scheme 2]) being yielded as a white needle crystal.

The obtained precursor monomer (300 mg, 1.5 mmol), azobisisobutyronitrile (12.5 mg, 0.05 eq.), and acetic acid (1.5 ml, 1.0 M) as a solvent were charged in an ampule, then the mixture was frozen and degassed using a vacuum line, and the ampule was sealed. The mixture was reacted in an inert atmosphere at 85° C. for 3 hours. After the completion of the reaction, acetic acid was removed by evaporation. Then, the residue was dissolved in a small amount of chloroform and was purified by reprecipitation to yield a precursor polymer (sign 2 in [Scheme 2]) as a white powder.

Next, in a recovery flask, the precursor polymer (358 mg, 1.5 mmol), m-chloroperbenzoic acid (1.35 g, 5.0 eq.), and tetrahydrofuran (1.52 ml, 1.0 M) as a solvent were charged and the mixture was polymerized at room temperature under atmospheric pressure for 1 hour. After the completion of the reaction, the product was purified by reprecipitation (diethyl ether/hexane=1:1) to yield PTMA (sign 3 in [Scheme 2]) as a pale red powder. The molecular weight was determined by gel permeation chromatography. The measurement result reveals a number average molecular weight of 5,000.

(Production of Photoelectric Element)

A semiconductor material adhering to the periphery of an electrode was scraped, and a hot-melt adhesive ("Bynel" manufactured by DUPONT-MITSUI POLYCHEMICALS CO., LTD.) as a sealer was disposed so as to surround the semiconductor. Next, an injection hole was formed with a diamond drill near the center of the electrode. To the electrode, a Pt counter electrode was bonded such that the electrode and the Pt counter electrode face each other.

Separately, in acetonitrile, PTMA, t-butylpyridine, and lithium perchlorate were dissolved so as to give concentrations of 0.1 mol/l, 0.025 mol/l, and 0.5 mol/l, respectively, to prepare an electrolyte solution.

Then, the electrolyte solution was poured through the injection hole, then the hole was sealed with an ultraviolet hardening resin, and a photoelectric element was consequently obtained.

Example 2

PTMA having a number average molecular weight of 20,000 was synthesized under a different polymerization condition. A photoelectric element was obtained in a similar manner to that in Example 1 except that the PTMA (molecular weight: 20,000) was used as the charge transport medium in place of PTMA used in Example 1.

Example 3

PTMA having a number average molecular weight of 30,000 was synthesized under a different polymerization condition. A photoelectric element was obtained in a similar manner to that in Example 1 except that the PTMA (molecular weight: 30,000) was used as the charge transport medium in place of PTMA used in Example 1.

Comparative Example 1

A photoelectric element was obtained in a similar manner to that in Example 1 except that 2,2,6,6-tetramethylpiperidine-1-oxyl (TEMPO) was used in place of PTMA used in Example 1.

[Evaluation]

To each photoelectric element, light was applied and photovoltaic conversion characteristics were evaluated based on the open circuit voltage and the maximum output. The photoirradiation condition was 200 lx.

Table 1 shows the results. As shown in Table 1, it was ascertained that the photoelectric elements of Examples 1 to 3 achieved higher open circuit voltages and higher maximum outputs than those of Comparative Example 1.

TABLE 1

| | Open circuit voltage (mV) | Maximum output ($\mu W/cm^2$) |
|---|---|---|
| Example 1 | 930 | 0.083 |
| Example 2 | 1060 | 0.11 |
| Example 3 | 1120 | 0.12 |
| Comparative Example 1 | 746 | 0.058 |

Example 4

In the reaction procedure shown in Scheme 3 below, a viologen compound was synthesized.

[Scheme 3]

[Chemical Formula 28]

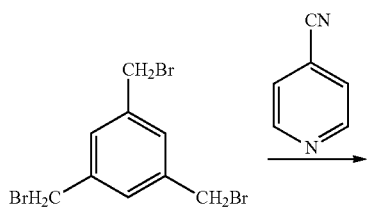

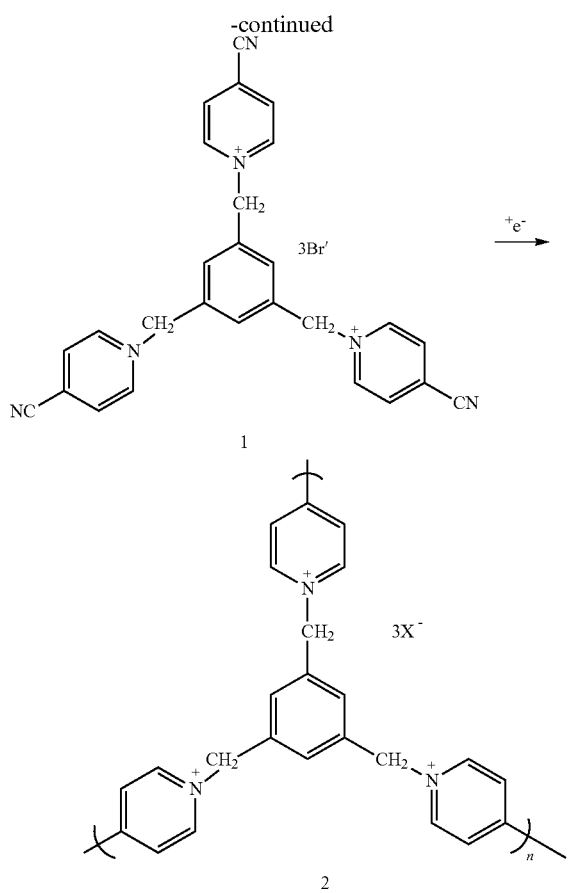

(Synthesis of Viologen Polymer Precursor)

First, 4-cyanopyridine and 1,3,5-(bromomethyl)-benzene were dissolved in acetonitrile and a mixture was refluxed at a boiling point in an inert atmosphere overnight. After the completion of the reaction, the product was purified by recrystallization (methanol) to yield a viologen polymer precursor represented by sign 1 in [Scheme 3] as a pale yellow needle crystal.

(Synthesis of Viologen Polymer)

The viologen polymer precursor obtained in Synthesis of Viologen Polymer Precursor was used to perform electrolytic polymerization. Consequently, a viologen polymer was synthesized. First, 0.02 M viologen polymer precursor was dissolved in 0.1 M aqueous sodium chloride solution. The resultant was set in a chamber for electrochemical measurement while a fluorine-doped $SnO_2$ (FTO) substrate was used as a work electrode, a platinum wire electrode was used as a counter electrode, and a silver/silver chloride electrode (Ag/AgCl) was used as a reference electrode. A voltage was swept from −1.0 V to 0 V (vs. Ag/AgCl). In the cyclic voltammogram, as the number of the sweeping times increased, an oxidation-reduction wave at −0.58 V derived from a 4-cyanopyridinium group gradually decreased and two-stage oxidation-reduction waves increased at −0.48 V and −0.86 V. This result demonstrates the formation of a viologen moiety. As the polymerization progressed, a pale yellow film was grown, and the electrolytic polymerization afforded a viologen polymer represented by sign 2 in [Scheme 3]. In IR measurement of the obtained electrolytic polymerization film, a peak (IR: 2224 $cm^{-1}$) derived from a cyano group was decreased. This result demonstrates the progress of the polymerization.

(Production of Semiconductor Device)

The resultant was set in a chamber for electrochemical measurement while the FTO electrode with the viologen polymer film was used as above as a work electrode, a platinum wire electrode was used as a counter electrode, a silver/silver chloride electrode was used as a reference electrode, and a sodium chloride solution was used as a supporting electrolyte solution. Then, the measurement was carried out by cyclic voltammetry and stable, reversible oxidation-reduction waves derived from the viologen were observed at −0.48 V and −0.86 V with respect to the reference electrode. This result demonstrates n-type behavior. Furthermore, the oxidation-reduction waves were stably observed even by repeated application of voltage (40 cycles). This result demonstrates stable behavior.

With controlling the supplied power by use of the electrolytic polymerization, a viologen polymer film having a thickness of 40 nm was formed on the FTO electrode.

Next, onto the viologen polymer film formed as above, a saturated solution of D131 dye represented by [Chemical Formula 26] in acetonitrile was applied by spin coating and thus the sensitizing dye was supported to modify the semiconductor.

(Synthesis of PTAM-PSS)

In the reaction procedure shown in Scheme 4 below, PTAM-PSS was synthesized. PTAM-PSS (poly(tetramethylpiperidinoxy)acrylamide-poly(sodium styrenesulfonate)) was a preferred example of the water-soluble polymer of a nitroxide radical compound having an organic acid salt or an organic base salt.

[Scheme 4]

[Chemical Formula 29]

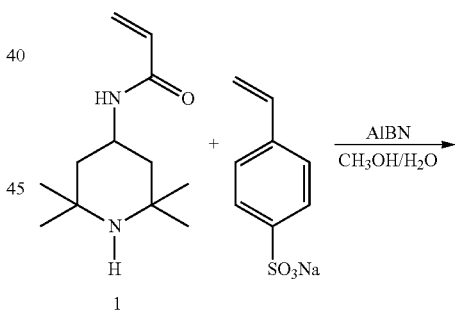

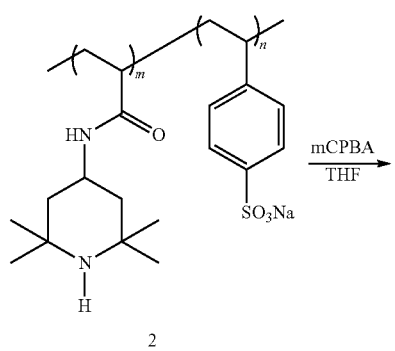

-continued

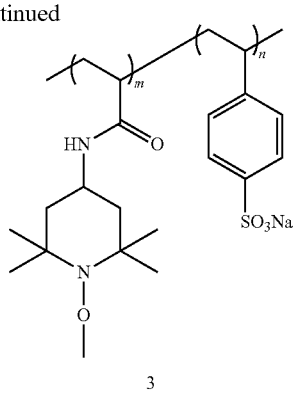

3

First, into a 300-ml three-necked recovery flask, 4-amino-2,2,6,6-tetramethylpiperidine (5.04 g, 32 mmol), triethanolamine (8.9 ml, 64 mmol), and benzene (120 ml, 0.25 M) as a solvent were charged and the mixture was cooled at 0° C. under an argon atmosphere for 15 minutes. Next, to the mixture, acrylic chloride (1.7 ml, 21.2 mmol, 0.66 eq.) was added and the mixture was further stirred in an argon stream at room temperature for 2 hours. The reaction solution was extracted (dichloromethane/aqueous calcium carbonate solution) and the dichloromethane layer was dried. The dichloromethane layer was fractionated by column chromatography (chloroform/methanol=5:1) and was recrystallized (hexane), thereby a PTAM precursor monomer (sign 1 in [Scheme 4]) being yielded as a white needle crystal.

The PTAM precursor monomer synthesized above and sodium p-styrenesulfonate (charged ratio 1:1) and azobisisobutyronitrile (AIBN) were dissolved in a mixed solvent of methanol/water=1:1 (volume ratio) as a solvent. The solution was charged in an ampule and was frozen and degassed using a vacuum line, and the ampule was sealed. The mixture was reacted in an inert atmosphere at 85° C. for 3 hours. After the completion of the reaction, the solvents were removed by evaporation. Then, the residue was purified by reprecipitation to yield a precursor polymer represented by sign 2 in [Scheme 4]. Next, the obtained precursor polymer, m-chloroperbenzoic acid (mCPBA), and tetrahydrofuran as a solvent were charged in a recovery flask and the mixture was reacted at room temperature under atmospheric pressure for 1 hour. After the completion of the reaction, the product was purified by reprecipitation (diethyl ether/hexane=1:1) to yield a PTAM-PSS polymer represented by sign 3 in [Scheme 4] as an orange powder. The molecular weight was determined by gel permeation chromatography. The result reveals a number average molecular weight of 5,000.

(Production of Photoelectric Element)

A semiconductor material adhering to the periphery of an electrode was scraped, and a hot-melt adhesive ("Bynel" manufactured by DUPONT-MITSUI POLYCHEMICALS CO., LTD.) as a sealer was disposed so as to surround the semiconductor. Next, an injection hole was formed with a diamond drill near the center of the electrode. To the electrode, a Pt counter electrode was bonded to face the electrode.

Separately, PTAM-PSS and sodium chloride were dissolved in water so as to give concentrations of 0.1 mol/l and 0.5 mol/l, respectively, to prepare an electrolyte solution.

Then, the electrolyte solution was poured through the injection hole, then the hole was sealed with an ultraviolet hardening resin, and a photoelectric element was consequently obtained.

Example 5

PTAM-PSS having a number average molecular weight of 20,000 was synthesized under a different polymerization condition. A photoelectric element was obtained in a similar manner to that in Example 4 except that the PTAM-PSS (molecular weight: 20,000) was used as the charge transport medium in place of PTAM-PSS used in Example 1.

Example 6

PTAM-PSS having a number average molecular weight of 60,000 was synthesized under a different polymerization condition. A photoelectric element was obtained in a similar manner to that in Example 4 except that the PTAM-PSS (molecular weight: 60,000) was used as the charge transport medium in place of PTAM-PSS used in Example 1.

Comparative Example 2

A photoelectric element was obtained in a similar manner to that in Example 4 except that 2,2,6,6-tetramethylpiperidine-1-oxyl (TEMPO) was used in place of PTAM-PSS used in Examples 4.

[Evaluation]

To each photoelectric element, light was applied and photovoltaic conversion characteristics were evaluated based on the open circuit voltage and the maximum output. The photoirradiation condition was 200 lx.

Table 2 shows the results. As shown in Table 2, it was ascertained that the photoelectric elements of Examples 4 to 6 achieved higher open circuit voltages and higher maximum outputs than those of Comparative Example 2.

TABLE 2

| | Open circuit voltage (mV) | Maximum output ($\mu W/cm^2$) |
|---|---|---|
| Example 4 | 680 | 0.075 |
| Example 5 | 810 | 0.11 |
| Example 6 | 960 | 0.15 |
| Comparative Example 2 | 410 | 0.052 |

REFERENCE SIGNS LIST

1 Electron transport layer
2 Gel layer
3 First electrode
4 Second electrode
5 Hole transport layer
6 First substrate
7 Second substrate

The invention claimed is:
1. A photoelectric element comprising:
a first electrode; a second electrode; an electron transport layer and a hole transport layer interposed between the first electrode and the second electrode; an electrolyte solution; and a sensitizing dye,
wherein:
the electron transport layer includes an organic compound having an oxidation-reduction site capable of repeated oxidation-reduction;
the electrolyte solution serves to stabilize a reduction state of the oxidation-reduction site;
the organic compound and the electrolyte solution form a gel layer;

the sensitizing dye is in contact with the electron transport layer; and the hole transport layer contains a charge transporter, the charge transporter serving to reduce an oxidized form of the sensitizing dye and having a number average molecular weight of 2,000 or more and 100,000 or less; and the charge transporter is poly(tetramethylpiperidinoxy) methacrylate.

2. The photoelectric element according to claim 1, wherein the electron transport layer contains at least one of an imide derivative, a quinone derivative, a viologen derivative, and a phenoxyl derivative.

3. A photoelectric element comprising:

a first electrode; a second electrode; an electron transport layer and a hole transport layer interposed between the first electrode and the second electrode; an electrolyte solution; and a sensitizing dye, wherein:

the electron transport layer includes an organic compound having an oxidation-reduction site capable of repeated oxidation-reduction;

the electrolyte solution serves to stabilize a reduction state of the oxidation-reduction site;

the organic compound and the electrolyte solution form a gel layer;

the sensitizing dye is in contact with the electron transport layer; and the hole transport layer contains a charge transporter, the charge transporter serving to reduce an oxidized form of the sensitizing dye and having a number average molecular weight of 2,000 or more and 100,000 or less;

the electrolyte solution is an aqueous solution; and the charge transporter is a water-soluble polymer of a nitroxide radical compound having an organic acid salt or an organic base salt.

4. The photoelectric element according to claim 3, wherein the electron transport layer contains at least one of an imide derivative, a quinone derivative, a viologen derivative, and a phenoxyl derivative.

\* \* \* \* \*